United States Patent
Kamepalli et al.

(10) Patent No.: US 11,017,823 B1
(45) Date of Patent: May 25, 2021

(54) SYSTEM AND METHOD FOR DYNAMIC ADJUSTMENT OF SSD CRITICAL TEMPERATURE THRESHOLD BASED ON MEMORY SIZE

(71) Applicant: Dell Products L.P., Round Rock, TX (US)

(72) Inventors: Srinivas Kamepalli, Austin, TX (US); Kan Lip Vui, Singapore (SG); Travis North, Cedar Park, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 16/824,807

(22) Filed: Mar. 20, 2020

(51) Int. Cl.
*G11C 7/04* (2006.01)
*G01K 7/42* (2006.01)
*G06F 12/16* (2006.01)
*G06F 12/02* (2006.01)

(52) U.S. Cl.
CPC .............. *G11C 7/04* (2013.01); *G01K 7/425* (2013.01); *G06F 12/0246* (2013.01); *G06F 12/16* (2013.01)

(58) Field of Classification Search
CPC ....... G11C 7/04; G01K 7/425; G06F 12/0246; G06F 12/16
See application file for complete search history.

(56) References Cited

U.S. PATENT DOCUMENTS

| | | | |
|---|---|---|---|
| 9,152,568 B1* | 10/2015 | Seigler | G06F 11/3058 |
| 2017/0255389 A1* | 9/2017 | Tan | G06F 3/0679 |
| 2019/0278510 A1* | 9/2019 | Kaynak | G06F 3/0634 |

* cited by examiner

*Primary Examiner* — David Yi
*Assistant Examiner* — Alan Otto
(74) *Attorney, Agent, or Firm* — Baker Botts L.L.P.

(57) ABSTRACT

A system and method for dynamically adjusting a critical temperature threshold of non-volatile memory to ensure full capture of information to non-volatile memory before the information handling system hibernates. If the operating temperature of the non-volatile memory reaches a critical temperature threshold, a controller determines the memory size of information in volatile memory. If there is a maximum memory size, the controller uses the default critical temperature threshold as the critical temperature threshold and initiates a process to write information to the non-volatile memory and hibernates the system. If there is less than the maximum memory size, the controller may dynamically increase the critical temperature threshold based on the memory size such that the information in volatile memory can be written to the non-volatile memory before the information handling system hibernates.

20 Claims, 3 Drawing Sheets

SYSTEM AND METHOD FOR DYNAMIC ADJUSTMENT OF SSD CRITICAL TEMPERATURE THRESHOLD BASED ON MEMORY SIZE

BACKGROUND

Field of the Disclosure

This disclosure relates generally to information handling systems and, more particularly, to systems and methods for safe hibernation of an information handling system and dynamically adjusting a critical temperature threshold of non-volatile memory.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Due to implementations of non-volatile memory such as Solid-State Device (SSD) technology today, an information handling system may be configured with a platform management system to transition to a lower system power state level (S3/Standby) to prevent blue screens or data loss in the event an operating temperature exceeds a critical temperature threshold. As the information handling system transitions from S3 to an advanced power management state (S0ix/Modern Standby), limitations may force the information handling system to transition to a lower system power state (S4/hibernation).

Embodiments disclosed herein manage information handling systems with large memory configurations while maintaining non-volatile memory performance. A platform management system may determine non-volatile memory such as an SSD has an operating temperature equal to a critical temperature threshold that could trigger the information handling system to hibernate. Embodiments may determine the memory size of information in volatile memory and dynamically adjust the critical temperature threshold based on the memory size. The adjusted critical temperature threshold may be based on an expected temperature increase associated with the time needed to write to the non-volatile memory before the non-volatile memory operating temperature reaches a critical temperature. Embodiments may dynamically adjust the critical temperature threshold of non-volatile memory based on the memory size, the operating temperature of the non-volatile memory, the expected time period needed to write the memory size to the non-volatile memory and the expected change in the operating temperature of the non-volatile memory over the time period. Dynamically adjusting a critical temperature threshold of the non-volatile memory allows the information handling system to capture all information from the volatile memory to non-volatile memory before safely transitioning the information handling system to system power state S4 (hibernation).

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
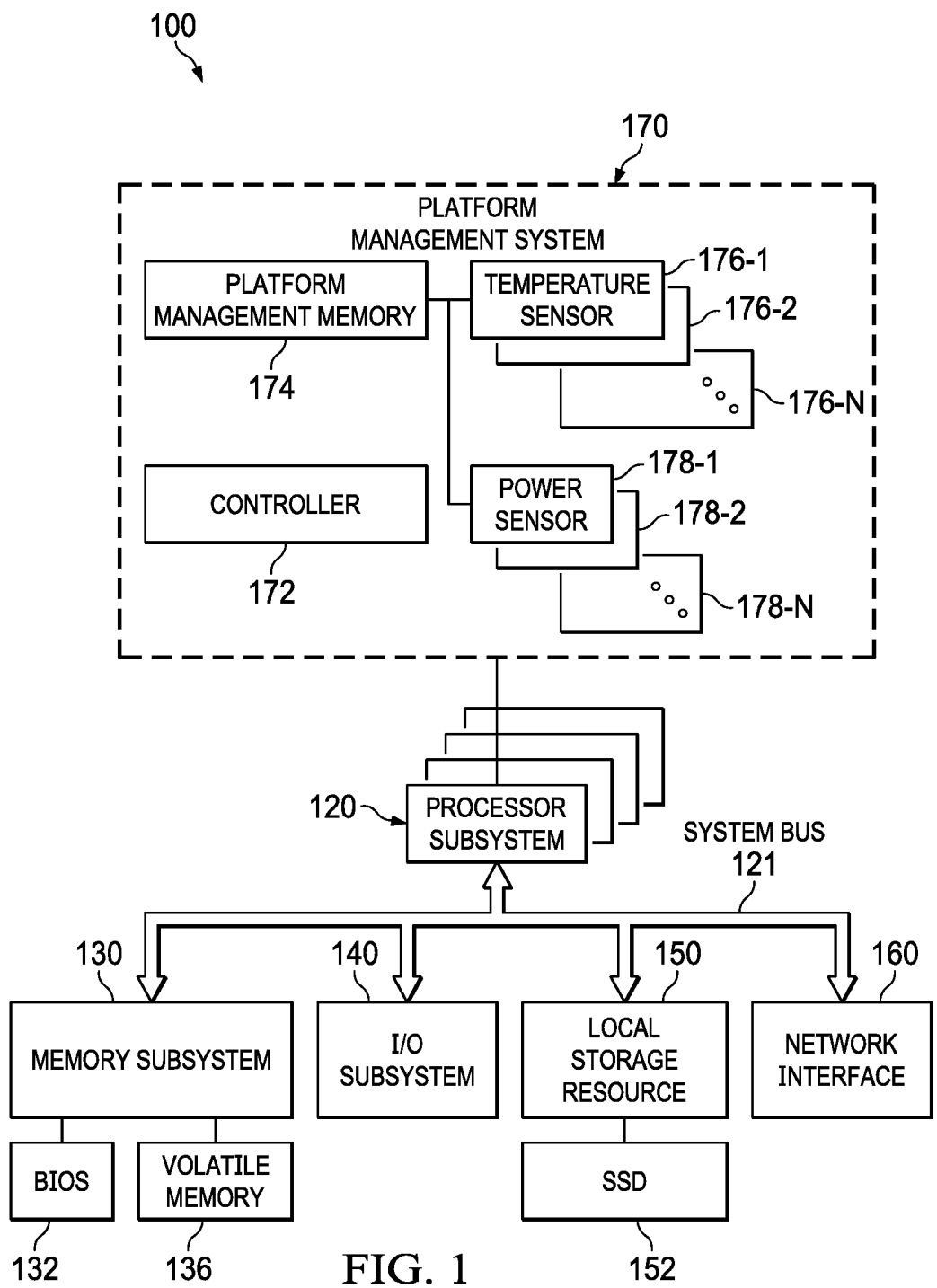
FIG. 1 is a block diagram of selected elements of an embodiment of a portable information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Information handling systems may use two level memory (2LM) to benefit from the speed of volatile memory and the storage capabilities of non-volatile memory such as Solid-State Devices (SSDs). Non-volatile memory devices have a critical temperature above which the device stops performing and/or is damaged. To protect data and mitigate damage to the non-volatile memory device due to the device exceeding the critical temperature, many information handling systems transition to system power state S4. The point at which a device signals the information handling system to transition to a lower power state may be referred to as a critical temperature threshold, which is lower than the critical temperature. For example, an SSD may have a critical temperature of 55° C., above which the SSD may stop writing and/or the SSD is damaged. A vendor may specify a critical temperature threshold for the SSD at 50° C. such that the SSD never exceeds the critical temperature. In many information handling systems, at startup, a BIOS loads critical temperature thresholds for components of the information handling system.

In many of these information handling systems, platform management systems such as DPTF (Dynamic Platform and Thermal Framework) are configured to read operating temperatures from sensors, compare the operating temperatures against the critical temperature thresholds, and transition the information handling system to system power state S4 (hibernation) if an operating temperature exceeds a critical temperature threshold to prevent damage (e.g., blue screens) or data loss.

As the information handling system transitions to S4, the information handling system must save a file (e.g. hiberfile.sys) of the current state of the information handling system. The file varies based on the memory size of the information handling system. As the system writes to non-volatile memory, the non-volatile memory power usage increases, causing the operating temperature of the non-volatile memory to increase. For example, based upon transient response, SSD operating temperatures can change over 10° C./second. If the SSD operating temperature has exceeded an SSD critical temperature threshold, many platform management systems automatically transition the information handling system to hibernate to prevent any further increase in power usage from causing the operating temperature to exceed the critical temperature. Unfortunately, data in volatile memory is lost.

As new technologies such as Two-Level memory (2LM) develop, the volatile memory size will increase substantially, making this issue more significant.

Embodiments disclosed herein are described with respect to Solid-State Drives (SSDs) but may also be practiced with other forms of non-volatile memory (NVM). Particular embodiments are best understood by reference to FIGS. 1-4 wherein like numbers are used to indicate like and corresponding parts.

Turning to the drawings, FIG. 1 illustrates a block diagram depicting selected elements of an embodiment of information handling system 100. It is noted that FIG. 1 is not drawn to scale but is a schematic illustration.

As shown in FIG. 1, components of information handling system 100 may include, but are not limited to, a processor subsystem 120, which may comprise one or more processors, and a system bus 121 that communicatively couples various system components to processor subsystem 120 including, for example, a memory subsystem 130, an I/O subsystem 140, local storage resource 150, and a network interface 160. Also shown within information handling system 100 are volatile memory 136, platform management system 170 with controller 172 coupled to platform management memory 174, temperature sensors 176-1 to 176-N and power usage sensors 178-1 to 178-N. Memory 130 may contain BIOS 132 having access to parameters of components in information handling system 100, discussed below in more detail.

Processor subsystem 120 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 120 may interpret and execute program instructions and process data stored locally (e.g., in memory subsystem 130). In the same or alternative embodiments, processor subsystem 120 may interpret and execute program instructions and process data stored remotely (e.g., in a network storage resource).

System bus 121 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory subsystem 130 may comprise a system, device, or apparatus operable to retain and retrieve program instructions and data for a period of time (e.g., computer-readable media). Memory subsystem 130 may comprise BIOS 132 and volatile memory 136 such as random access memory (RAM) or a suitable selection or array of volatile memory 136.

In information handling system 100, I/O subsystem 140 may comprise a system, device, or apparatus generally operable to receive and transmit data to or from or within information handling system 100. I/O subsystem 140 may represent, for example, a variety of communication interfaces, graphics interfaces, video interfaces, user input interfaces, and peripheral interfaces. In various embodiments, I/O subsystem 140 may be used to support various peripheral devices, such as a touch panel, a display adapter, a keyboard, an accelerometer, a touch pad, a gyroscope, or a camera, among other examples. In some implementations, I/O subsystem 140 may support so-called 'plug and play' connectivity to external devices, in which the external devices may be added or removed while portable information handling system 100 is operating. In some embodiments, a power management system such as ACPI (Advanced Computing and Power Interface) may allow platform management system 170 to perform power management of components and status monitoring of information handling system 100, discussed below.

Local storage resource 150 may comprise non-volatile memory (NVM) such as computer-readable media. Computer-readable media may include Solid-State Drive (SSD) 152. Local storage resource 150 such as SSD 152 may be generally operable to store instructions and data on demand in system power state S0 (working state) as well as when information handling system 100 is in system power states S1-S4 (Standby to Hibernate) and S5 (complete shutdown).

Network interface 160 may be a suitable system, apparatus, or device operable to serve as an interface between information handling system 100 and a network (not shown). Network interface 160 may enable information handling system 100 to communicate over the network using a suitable transmission protocol or standard. In some embodiments, network interface 160 may be communicatively coupled via the network to a network storage resource (not shown). The network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). The network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. The network coupled to network interface 160 or various components associated therewith may be implemented using hardware, software, or any combination thereof.

As depicted in FIG. 1, platform management system 170 may include controller 172 communicatively coupled to platform management memory 174, temperature sensors 176-1 to 176-N and power usage sensors 178-1 to 178-N. Platform management memory 174 may contain instructions for dynamically adjusting critical temperature thresholds for various components in information handling system 100, including critical temperature thresholds for non-volatile memory such as SSD 152.

Controller 172 may read temperatures from temperature sensors 176-1 to 176-N associated with components of information handling system 100.

Platform management memory 174 may contain instructions for controller 172 to determine if a temperature of a selected component exceeds a critical temperature threshold and determine, based on a memory size in volatile memory 136, whether to initiate a process to transition information handling system 100 to hibernate or to increase the critical temperature threshold to delay the process. For example, if controller 172 reads a temperature from temperature sensor 176-1 associated with SSD 152 that indicates the operating temperature of SSD 152 exceeds a default critical temperature threshold of SSD 152 and the memory size present in volatile memory 136 is at or near a maximum size (e.g., 64 GB), controller 172 may initiate a process to write the information from volatile memory 136 to SSD 152 and transition information handling system 100 to hibernate. However, if controller 172 reads a temperature from a temperature sensor 176-1 associated with SSD 152 that indicates the operating temperature exceeds a critical temperature threshold of SSD 152 and the memory size present in volatile memory 136 is less than the maximum size (e.g., 8 GB of a possible 64 GB), controller 172 may dynamically adjust the critical temperature threshold for SSD 152 based on the memory size to delay information handling system 100 from writing the information from volatile memory 136 to SSD 152 and delay information handling system 100 from transitioning to hibernation.

Figure 2:
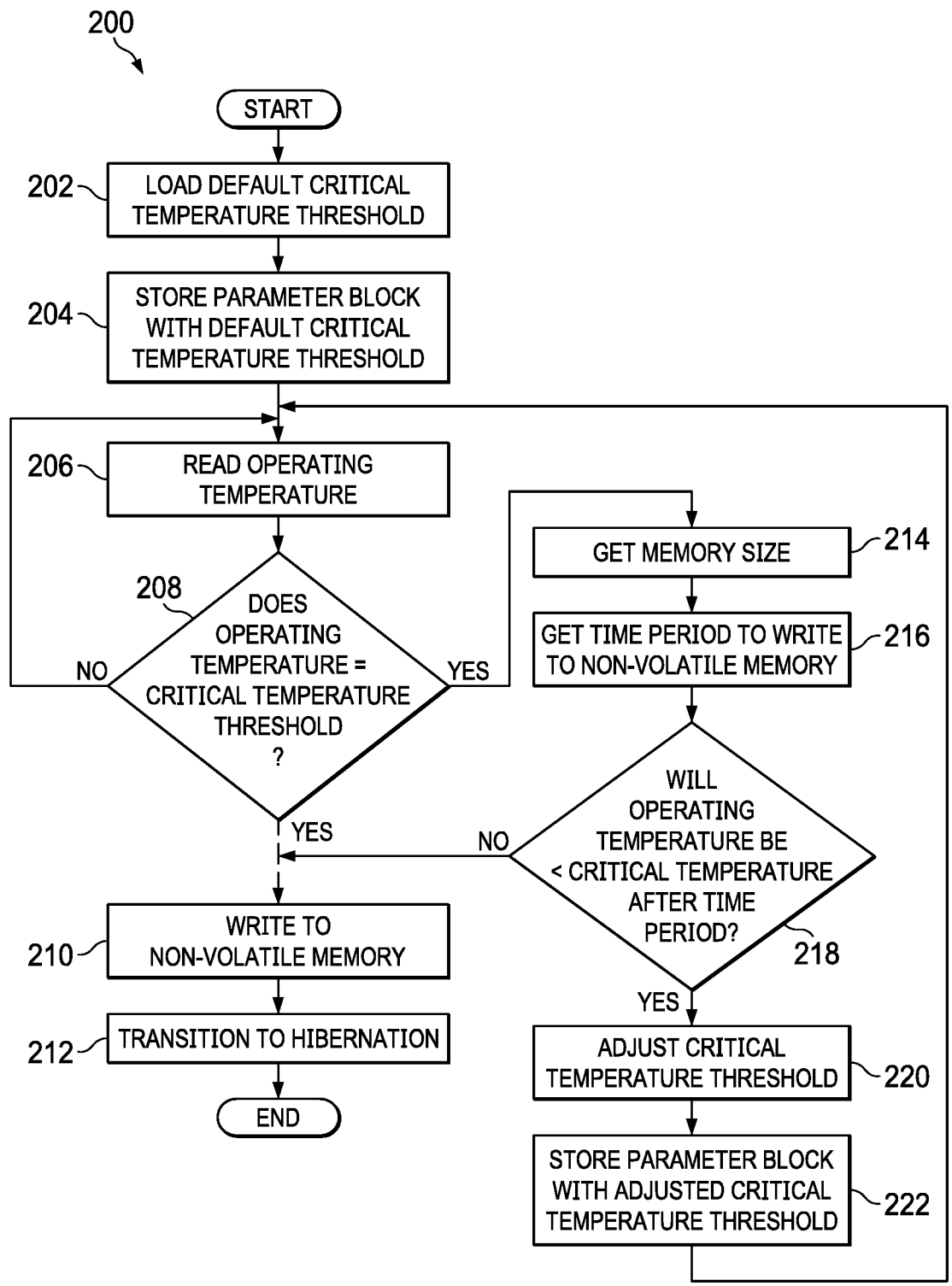
FIG. 2 is a flow diagram of an exemplary method for dynamically adjusting a critical temperature threshold of non-volatile memory in an information handling system for safe hibernation.

FIG. 2 depicts a flow diagram 200 of a method for controlling hibernation of an information handling system based on a critical temperature threshold for non-volatile memory. At step 202, a default critical temperature threshold may be loaded by BIOS 132. As used herein, a default critical temperature threshold may refer to a critical temperature threshold loaded at startup. A vendor may specify a default critical temperature based on a maximum memory size. For example, a non-volatile memory critical temperature may be 55° C. and a default critical temperature threshold may be set at 50° C. to allow a maximum memory size of 64 GB to be written before the operating temperature exceeds 55° C. A default critical temperature threshold may be set by a user. For example, a user may modify a default critical temperature to a lower value (e.g., 45° C.) or higher (e.g., 52° C.). At each startup, BIOS 132 loads the default critical temperature threshold.

At step 204 a parameter block for non-volatile memory including the critical temperature threshold may be stored in platform management memory 174.

During operation, at step 206, controller 172 may read the operating temperature of non-volatile memory. In some embodiments, controller 172 reads temperatures from temperature sensors 176.

At step 208, controller 172 determines if the operating temperature of non-volatile memory has reached (is equal to) the critical temperature threshold stored in platform management memory 174.

In many information handling systems, if controller 172 determines that the operating temperature of non-volatile memory exceeds the default critical temperature threshold that was loaded at startup, at step 210 controller 172 initiates a process to write information from volatile memory 136 to non-volatile memory and, at step 212, transitions information handling system 100 to hibernation.

FIG. 2 further depicts a flow diagram of a method for controlling hibernation of an information handling system based on a dynamically adjustable critical temperature threshold for non-volatile memory.

The method starts at step 202 when a default critical temperature threshold is loaded by BIOS 132. For example, at startup, BIOS 132 may load a default critical temperature threshold for SSD 152 of 50° C.

At step 204, controller 172 may request a parameter block for non-volatile memory including a copy of the critical temperature threshold and store the parameter block in memory platform management memory 174 or memory subsystem 130.

During operation of information handling system 100, at step 206, platform management system 170 continuously reads temperatures from one or more temperature sensors 176.

At step 208, controller 172 determines if an operating temperature of non-volatile memory is equal to the critical temperature threshold value stored in platform management memory 174 or memory 130.

Instead of automatically hibernating information handling system 100 if controller 172 reads a temperature associated with non-volatile memory and determines the operating temperature of the non-volatile memory exceeds a critical temperature threshold, controller 172 may execute a set of instructions stored in platform management system memory 174 to determine whether to hibernate information handling system 100 or dynamically adjust the critical temperature threshold of the non-volatile memory to delay hibernation of information handling system 100.

The memory size will determine how long information handling system 100 will need to write information from volatile memory 136 to non-volatile memory. At step 214, controller 172 may determine a memory size of information present in volatile memory 136. At step 216, controller 172 may determine how long information handling system 100 will need to write the memory size to non-volatile memory.

At step 218, controller 172 determines whether the operating temperature will be less than the critical temperature of the non-volatile memory after writing the memory size to the non-volatile memory. If controller 172 reads a temperature that exceeds the default critical temperature threshold and determines the memory size is at or near a maximum memory size, controller 172 may determine the operating temperature will reach the critical temperature. Accordingly, controller 172 may initiate a process to write information from volatile memory 136 to non-volatile memory at step 210 and transition information handling system 100 to hibernation at step 212. For example, if SSD 152 reaches a default critical temperature threshold of 50° C. and volatile memory 136 contains a maximum memory size of 64 GB of information, writing the information to SSD 152 may result in the operating temperature of SSD 152 reaching a critical (shutdown) temperature of 55° C. for SSD 152. Accordingly, controller 172 may signal information handling system 100 to write the information to SSD 152 at step 210 and hibernate information handling system 100 at step 212 based on the default critical temperature threshold of 50° C.

However, if there is less than a maximum memory size, information handling system 100 may be able to write the information to non-volatile memory in less time and not exceed the critical temperature. For example, if SSD 152 reaches a default critical temperature threshold of 50° C. and volatile memory 136 contains a memory size of 8 GB of information (of a maximum 64 GB memory size), writing the information to SSD 152 may result in the operating temperature of SSD 152 reaching only 52° C., which is 3° C. below the SSD critical temperature of 55° C. At step 220, platform management system 170 may dynamically increase the critical temperature threshold from the default critical temperature threshold of 50° C. to an adjusted critical temperature threshold of 53° C. Increasing the critical temperature threshold to 53° C. allows embodiments to delay transitioning information handling system 100 to hibernation.

At step 222, platform management system 170 may store an updated parameter block with an adjusted critical temperature threshold in memory 130 or platform management memory 174. As platform management system 170 monitors information handling system 100, at step 208, controller 172 may compare subsequent temperature readings from temperature sensor 176-1 against the updated parameter block in memory 130 or platform management memory 174 to determine when to initiate a process to write the information to SSD 152 at step 210 and hibernate information handling system 100 at step 212 based on the adjusted critical temperature threshold of 53° C.

Adjusting a critical temperature threshold may include determining a time period needed to write the memory size to non-volatile memory and a heat generation rate associated with writing the memory size.

In some embodiments, the time period needed to write the memory size may depend on one or more of the operating temperature and the rate of change of the operating temperature. For example, the speed at which SSD 152 may write information is generally slower at higher operating temperatures, resulting in a longer time period. Furthermore, as SSD 152 writes information, its operating temperature will increase, causing SSD 152 to write more slowly, further lengthening the time period.

Embodiments of platform management system 170 may dynamically adjust a critical temperature threshold from a first (e.g., default) critical temperature threshold to a second critical temperature threshold by selecting a parameter block from a plurality of pre-calculated parameter blocks.

Figure 3:
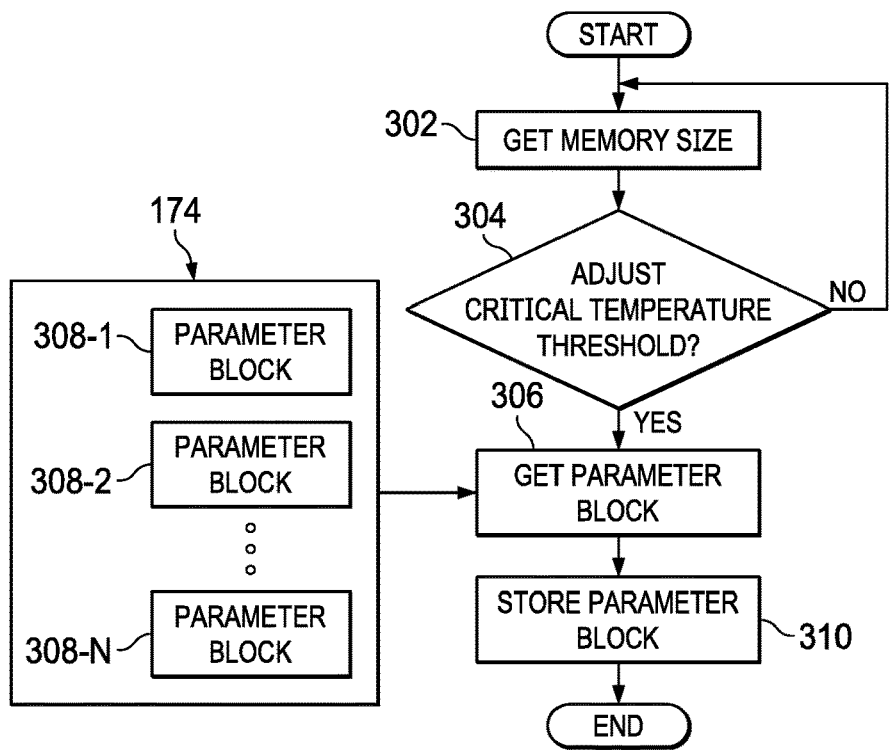
FIGS. 3 and 4 are flow diagrams for adjusting a critical temperature threshold for non-volatile memory in an information handling system.

FIG. 3 depicts a flow diagram of a method for dynamically adjusting a critical temperature threshold by selecting a parameter block from a plurality of pre-calculated parameter blocks, wherein each parameter block 308-1 to 308-N specifies an adjusted critical temperature threshold based on a possible memory size. In some embodiments, the adjusted critical temperature threshold in one or more parameter blocks 308 may be pre-calculated based on a memory size and an operating temperature of non-volatile memory.

In some embodiments, platform management memory 174 may store a plurality of parameter blocks 308, wherein the adjusted critical temperature threshold in each parameter block 308-1 to 308-N comprises a value based on a memory size.

The method begins when an operating temperature of non-volatile memory exceeds a critical temperature threshold. At step 302, controller 172 determines the memory size associated with information stored in volatile memory 136.

At step 304, controller 172 determines whether to request a parameter block with an adjusted critical temperature threshold for non-volatile memory based on the memory size determined in step 302. If the memory size is at or near a maximum memory size, controller 172 may determine to not request a parameter block with an adjusted critical temperature threshold.

However, at step 306, if the memory size is less than the maximum memory size, controller 172 may select a parameter block 308 from a plurality of parameter blocks 308-1 to 308-N. In some embodiments, a plurality of parameter blocks 308-1 to 308-N may be stored in platform management memory 174. Each parameter block 308-1 to 308-N may specify an adjusted critical temperature threshold for one memory size or a range of memory sizes. For example, controller 172 may determine the memory size is 8 GB and select a parameter block 308-1, wherein parameter block 308-1 may specify a critical temperature threshold of 53° C. based on the memory size of 8 GB.

In some embodiments, each parameter block 308-1 to 308-N may specify an adjusted critical temperature threshold based on the memory size, the operating temperature of the non-volatile memory, and the rate at which the operating temperature of the non-volatile memory is expected to increase over the time period needed to write the information to the non-volatile memory.

In some embodiments, each parameter block 308-1 to 308-N may specify an adjusted critical temperature threshold based on the memory size, the operating temperature of the non-volatile memory, and the power usage associated with non-volatile memory such as SSD 152. Power usage sensors 178-1 to 178-N may communicate power usage of components of information handling system 100. Power usage may be useful for predicting how much heat is expected to be generated by information handling system 100 or components of information handling system 100. For example, a first parameter block 308-1 may specify a first adjusted critical temperature threshold based on a first memory size, the operating temperature of the non-volatile memory, and the power usage associated with the non-volatile memory writing the first memory size at a first operating temperature of the non-volatile memory, and a second parameter block 308-2 may specify a second adjusted critical temperature threshold based on the first memory size but a second operating temperature of the non-volatile memory and the power usage associated with the non-volatile memory writing the first memory size at the second operating temperature of the non-volatile memory.

The method ends at step 310 when controller 172 stores the parameter block 308 containing the adjusted critical temperature threshold in platform management memory 174.

In some embodiments (not shown) an adjusted critical temperature threshold in one or more parameter blocks of the plurality of parameter blocks 308-1 to 308-N may be updated based on a previous instance of writing information to the non-volatile memory.

Figure 4:
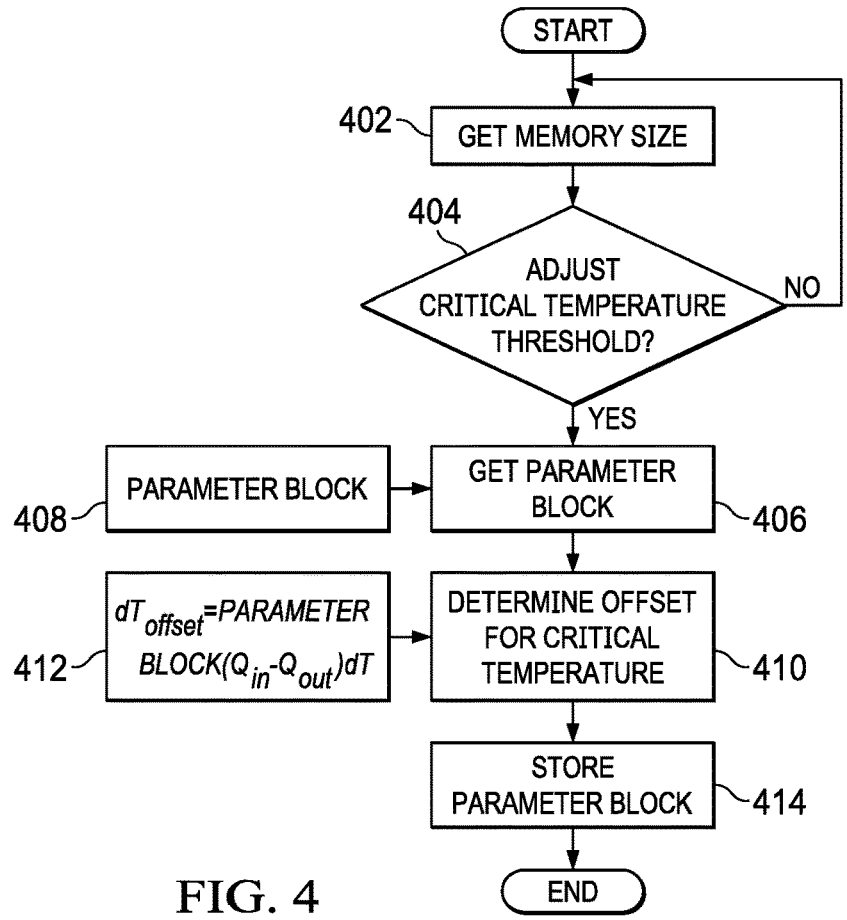

FIG. 4 depicts a flow diagram of a method for dynamically adjusting a critical temperature threshold based on a calculation of the critical temperature threshold. The method depicted in FIG. 4 may be useful in embodiments of information handling system 100 with dynamic memory.

The method begins when an operating temperature of non-volatile memory exceeds a critical temperature threshold. At step 402, controller 172 determines a memory size associated with information stored in volatile memory 136.

At step 404, controller 172 determines whether to adjust a critical temperature threshold for non-volatile memory based on the memory size determined in step 402. If the memory size is at or near a maximum memory size, controller 172 may determine to use the critical temperature threshold stored in platform management memory 174.

However, if the memory size is less than the maximum memory size, controller 172 may determine the critical temperature threshold should be adjusted. At step 406, controller 172 may get a parameter block from platform management memory 174. In some embodiments, parameter 408 may specify a critical temperature threshold based on the critical temperature. For example, a critical temperature of SSD 152 may be 55° C. and parameter block 408 may contain 55° C. as a critical temperature threshold corresponding to a memory size associated with no information in volatile memory 136.

At step 410, controller 172 may determine an offset ($dT_{OFFSET}$) to parameter block 408. In some embodiments, offset 412 may be calculated as the difference in temperature between heat generated by the system ($Q_{IN}$) minus heat transferred out of the system ($Q_{OUT}$) for the time period (dT) needed to write information from volatile memory 136 to non-volatile memory. For example, if the time period to store information to SSD 152 is 0.2 seconds, $Q_{IN}$ is 10° C./sec and $Q_{OUT}$ is 5° C./sec, the offset may be calculated as (10° C./sec-5° C./sec)*0.2 sec=1° C. In some embodiments, determining the heat generated by information handling system 100 comprises controller 172 receiving power usage information from power usage sensors 178, wherein $Q_{IN}$ may be proportional to the power usage information.

The method ends at step 414 when controller 172 adjusts the critical temperature threshold for the non-volatile memory and stores parameter block 408 containing the adjusted critical temperature threshold calculated with offset 412 in platform management memory 174 or memory 130. For the example above, if the critical temperature threshold in parameter block 408 is 55° C. and the offset is calculated as 1° C., controller may store parameter block 408 with 54° C. as the adjusted critical temperature threshold.

As described herein, the adjusted critical temperature threshold may be stored in memory subsystem 130 or platform management memory 174. However, when information handling system 100 hibernates or shuts down, the adjusted critical temperature threshold may be removed from memory subsystem 130 or platform management memory 174 such that, when information handling system starts or powers up from hibernation, the default critical temperature threshold is loaded and controller 172 initially compares operating temperatures for the non-volatile memory against the default critical temperature threshold.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. An information handling system with a platform management system, the information handling system comprising:
   a volatile memory;
   a non-volatile memory;
   a processor communicatively coupled to the volatile memory and the non-volatile memory; and
   a platform management system comprising:
      a controller; and
      a memory medium communicatively coupled to the controller, the memory medium storing a first critical temperature threshold and comprising a set of instructions executable by the controller to:
         determine an operating temperature of a non-volatile memory;
         if the operating temperature is equal to the first critical temperature threshold of the non-volatile memory:
            determine a memory size of information in the volatile memory;
            if the memory size is equal to a maximum memory size:
               communicate with the processor to write the information from the volatile memory to the non-volatile memory; and
               transition the information handling system to a lower power state;
            if the memory size is less than the maximum memory size:
               determine a second critical temperature threshold based on the memory size;
               store the second critical temperature threshold in the platform management memory.

2. The information handling system of claim 1, wherein the set of instructions are executable by the controller to:
   determine a time period needed to write the memory size to the non-volatile memory; and
   calculate the second critical temperature threshold based on a difference between an amount of heat generated by the non-volatile memory over the time period and an amount of heat removed from the information handling system over the time period.

3. The information handling system of claim 2, wherein the set of instructions are executable by the controller to communicate with a power usage sensor associated with the non-volatile memory to calculate the amount of heat generated by the non-volatile memory over the time period.

4. The information handling system of claim 1, wherein the set of instructions are executable by the controller to select a parameter block from a plurality of parameter blocks, each parameter block specifying a second critical temperature threshold based on the memory size and the operating temperature of the non-volatile memory.

5. The information handling system of claim 4, wherein:
the set of instructions are further executable by the controller to update the second critical temperature threshold in one or more of the plurality of parameter blocks based on a time period required to write a previous memory size to the non-volatile memory.

6. The information handling system of claim 1, wherein the set of instructions are executable by the controller to communicate with a temperature sensor associated with the non-volatile memory to determine the operating temperature of the non-volatile memory.

7. The information handling system of claim 1, wherein the first critical temperature threshold is a default critical temperature threshold loaded during a startup of the information handling system.

8. An information handling system, comprising:
a volatile memory;
a non-volatile memory;
a processor communicatively coupled to the volatile memory and the non-volatile memory, the processor configured to execute a set of instructions to load a default critical temperature threshold for a component during a startup process;
a platform management system comprising:
a controller; and
a memory medium communicatively coupled to the controller, the memory medium storing the default critical temperature threshold and comprising a set of instructions executable by the controller to:
determine an operating temperature of a non-volatile memory;
if the operating temperature is equal to the default critical temperature threshold of the non-volatile memory:
determine a memory size of information in the volatile memory;
if the memory size is equal to a maximum memory size:
communicate with the processor to write the information from the volatile memory to the non-volatile memory; and
transition the information handling system to a lower power state;
if the memory size is less than the maximum memory size:
determine an adjusted critical temperature threshold based on the memory size;
replace the default critical temperature threshold with the adjusted critical temperature threshold in the platform management memory.

9. The information handling system of claim 8, wherein the set of instructions are executable by the controller to communicate with a temperature sensor associated with the non-volatile memory to determine the operating temperature of the non-volatile memory.

10. The information handling system of claim 8, wherein the set of instructions are executable by the processor to:
determine a time period needed to write the memory size to the non-volatile memory; and
calculate the adjusted critical temperature threshold based on a difference between an amount of heat generated by the non-volatile memory over the time period and an amount of heat removed from the information handling system over the time period.

11. The information handling system of claim 10, wherein the set of instructions are executable by the controller to communicate with a power usage sensor associated with the non-volatile memory to calculate the amount of heat generated by the non-volatile memory over the time period.

12. The information handling system of claim 8, wherein the set of instructions are executable by the controller to select a parameter block from a plurality of parameter blocks, each parameter block containing specifying an adjusted critical temperature threshold based on the memory size and the operating temperature of the non-volatile memory.

13. The information handling system of claim 12, wherein:
the set of instructions are further executable by the controller to update the adjusted critical temperature threshold in one or more of the plurality of parameter blocks based on a time period required to write a previous memory size to the non-volatile memory.

14. The information handling system of claim 8, wherein the adjusted critical temperature threshold is removed from the memory medium when the information handling system powers down.

15. A computer-implemented method for dynamically adjusting a critical temperature threshold of non-volatile memory based on a memory size of information in a volatile memory in an information handling system, the method comprising:
determining an operating temperature of the non-volatile memory;
if the operating temperature of the non-volatile memory is equal to a critical temperature threshold of the non-volatile memory:
determining a memory size of information in the volatile memory;
if the memory size is equal to a maximum memory size:
communicating with a processor to write the information from the volatile memory to the non-volatile memory; and
transitioning the information handling system to a lower power state;
if the memory size is less than the maximum memory size:
determining an adjusted critical temperature threshold corresponding to the memory size; and
replacing the critical temperature threshold with the adjusted critical temperature threshold; and
storing a parameter block with the adjusted critical temperature threshold to the platform management memory.

16. The method of claim 15, wherein determining the operating temperature of the non-volatile memory comprises communicating with a temperature sensor associated with a Solid-State Device (SSD).

17. The method of claim 15, wherein determining an adjusted critical temperature threshold corresponding to the memory size comprises:
determining a time period needed to write the memory size to the non-volatile memory; and
calculating the adjusted critical temperature threshold based on a difference between an amount of heat generated by the non-volatile memory over the time period and an amount of heat removed from the information handling system over the time period.

18. The method of claim 17, wherein calculating the adjusted critical temperature threshold comprises communicating with a power usage sensor associated with the non-volatile memory to calculate the amount of heat generated by the non-volatile memory over the time period.

19. The method of claim 15, wherein determining the adjusted critical temperature comprises selecting a parameter block from a plurality of parameter blocks, each parameter block containing an adjusted critical temperature threshold based on the memory size and the operating temperature of the non-volatile memory.

20. The method of claim 19, further comprising updating the adjusted critical temperature threshold in one or more of the plurality of parameter blocks based on a time period required to write a previous memory size to the non-volatile memory.

* * * * *